United States Patent [19]

Olson et al.

[11] Patent Number: 5,064,378
[45] Date of Patent: Nov. 12, 1991

[54] MOUNTING OF DRAMS OF DIFFERENT SIZES AND PINOUTS WITHIN LIMITED FOOTPRINT

[75] Inventors: Anthony M. Olson, Stevensville; Babu Rajaram, St. Joseph, both of Mich.

[73] Assignee: Zenith Data Systems Corporation, Buffalo Grove, Ill.

[21] Appl. No.: 294,925

[22] Filed: Dec. 30, 1988

Related U.S. Application Data

[63] Continuation of Ser. No. 88,934, Aug. 24, 1987, abandoned.

[51] Int. Cl.$^5$ ............................................. H05K 1/00
[52] U.S. Cl. .................................... 439/68; 439/55; 174/261
[58] Field of Search ................... 439/55–83, 439/525; 174/68.5, 250, 261, 255

[56] References Cited

U.S. PATENT DOCUMENTS

| | | | |
|---|---|---|---|
| 3,339,008 | 8/1967 | MacArthur et al. | 439/55 |
| 4,362,899 | 12/1982 | Borrill | 174/68.5 |
| 4,388,136 | 6/1983 | Huie et al. | 174/68.5 |
| 4,434,321 | 2/1984 | Betts | 174/68.5 |
| 4,467,400 | 8/1984 | Stopper | 174/68.5 |
| 4,524,240 | 6/1985 | Stock et al. | 174/68.5 |
| 4,613,924 | 9/1986 | Brault | 174/68.5 |

*Primary Examiner*—David L. Pirlot
*Attorney, Agent, or Firm*—Emrich & Dithmar

[57] ABSTRACT

Four parallel, spaced arrays of apertures are provided in a printed circuit (PC) board to accommodate mounting of 16- and 18-pin dynamic random access memories (DRAMs) within a minimum area footprint. First and second 8-aperture linear arrays are provided in the PC board in spaced relation to accommodate 16-pin DRAMs as are third and fourth 9-aperture linear arrays to accommodate 18-pin DRAMs, wherein the third and fourth arrays of apertures are aligned parallel with and respectively positioned intermediate and outside of the first and second arrays of apertures in the PC board. Corresponding apertures in the 16- and 18-aperture arrays for receiving corresponding pins of the 16- and 18- pin DRAMs are electrically coupled, with the two additional apertures of the 18-aperture array extending beyond the 16-aperture array and aligned therewith. The limited footprint area is thus capable of receiving, mounting and electrically coupling in circuit either a 16-pin or an 18-pin DRAM or any integrated circuit having a dual-in-line pinout configuration.

3 Claims, 1 Drawing Sheet

MOUNTING OF DRAMS OF DIFFERENT SIZES AND PINOUTS WITHIN LIMITED FOOTPRINT

BACKGROUND OF THE INVENTION

This invention relates generally to integrated circuits having parallel, spaced arrays of leads and is particularly directed to the mounting and coupling in circuit of two dynamic random access memories of different sizes and having different numbers of leads or pinouts.

An integrated circuit (IC) is an interconnected array of active and passive elements integrated with a single semiconductor substrate or deposited on the substrate by a continuous series of compatible processes. The IC is typically capable of performing at least one complete electronic circuit function. Normally, only the input, output and supply terminals, or pinouts, are accessible, with the various active and passive circuit elements encapsulated in a plastic housing from which the various pinouts extend to facilitate coupling of the IC to other circuitry. The pinouts or leads may be arranged in various configurations, but perhaps the most common pinout arrangement is in the form of a dual-in-line package consisting of a pair of spaced, linearly aligned, parallel lead arrays extending from facing edges of the generally rectangular IC plastic housing.

One type of IC in common use is a random access memory (RAM), which may be either of the dynamic or static type. Static RAMs (SRAMs) are generally of the CMOS type and are characterized in that data stored therein remains in the RAM indefinitely, or at least until power is removed from the static RAM. Dynamic RAMs (DRAMs), on the other hand, require a refresh system for maintaining data in memory, but offer a greater memory capacity at lower cost than SRAMs. Thus, DRAMs are particularly adapted for systems requiring large memory capacities wherein a memory backup is not required.

DRAMs are typically of the dual-in-line type wherein a pair of spaced, parallel, linear pinout arrangements extend from facing lateral edges of a plastic housing. Most available DRAMs have a capacity of either 64 or 256 kilobits and include 16 pinouts extending therefrom. More recently, larger capacity DRAMs have become available which are capable of storing one and even as much as four megabits of data. These larger capacity DRAMs are slightly longer in size, although still of a generally rectangular shape, and are characterized as having 18 leads extending therefrom. Thus, while the 64k and 256k are mutually compatible in terms of mounting and electrical coupling requirements, as are the 1Meg and the 4Meg DRAMs, the larger capacity DRAMs, i.e., 1Meg and 4Meg, are not compatible with those having a smaller memory capacity, i.e., 64k and 256k. Therefore, PC boards designed for use with 64k or 256k DRAMs cannot be upgraded to accommodate the newer 1Meg and larger DRAMs by using the same PC board socket. Thus, different PC boards are required for accommodating different size DRAMs. This situation requires PC board suppliers to maintain larger inventories and limits PC board flexibility in terms of meeting future application expansion.

The present invention is intended to overcome the limitations of the prior art by providing a PC board mounting and coupling arrangement which is adapted to accommodate two IC configurations of different size and having different pinout arrangements within a minimum footprint area on the surface of a PC board.

OBJECTS OF THE INVENTION

Accordingly, it is an object of the present invention to facilitate the mounting and coupling in circuit on a PC board of integrated circuit packages having different numbers of pinouts.

It is another object of the present invention to provide a single mounting arrangement for a PC board which is capable of accommodating a 16-pin or an 18-pin DRAM.

Still another object of the present invention is to provide for the mounting and coupling in circuit of two integrated circuits of different size and having different numbers of electrical leads within a minimum footprint.

A further object of the present invention is to minimize the space and the number of apertures required for mounting and coupling in circuit either one of two integrated circuits of different size and having different numbers of pinouts.

A still further object of the present invention is to provide a PC board configuration with increased flexibility in the mounting of IC packages of different sizes and pinout arrangements.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, in which:

DETAILED DESCRIPTION OF THE PREFERRED EMBODIMENT

Figure 1:
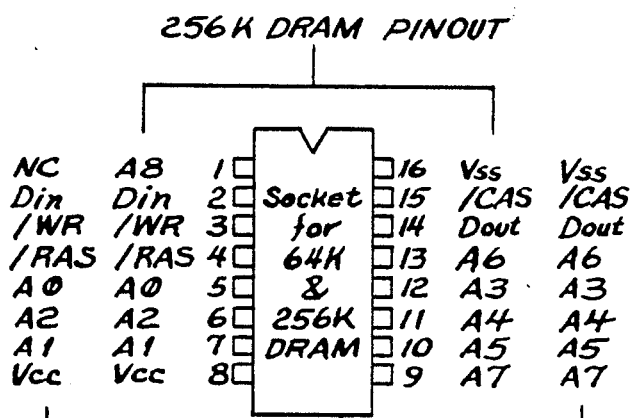
FIG. 1 is a simplified schematic diagram illustrating the pinout arrangement for 64k and 256k DRAMs.

Referring to FIG. 1, there is shown a 64k or a 256k DRAM 20 having a plurality of numbered pinouts associated therewith. The pin assignments for a 64K DRAM are depicted in the two outer columns illustrated in FIG. 1, while the pin assignments for a 256k DRAM are illustrated in the two inner columns on respective sides of the IC 20 depicted therein. The 64k/256k DRAM 20 includes 16 pinouts or leads arranged in a pair of spaced parallel arrays extending from respective facing edge portions of the IC's housing. As shown in the figure, pinouts 5 through 7 and 9 through 13 provide address information to the 64k DRAM for the purpose of either writing data into or reading data from the DRAM via the Din and Dout pinouts. These pinouts as well as pinout A8 provide address information to the 256k DRAM. It should be noted that the 64k and 256k DRAMs utilize the same pinouts for memory address information and the same pinouts for data transfer. Similarly, the same pinouts are used in both types of DRAMs for /WR (Read/Write), /RAS (Row Address Strobe), Vcc (supply voltage), Vss (ground potential), and /CAS (Column Address Strobe). It should also be noted that in the 64k DRAM pin No. 1 is not used, while in the 256k DRAM this pin is used as an additional address pinout. Thus, from FIG. 1 it can be seen that the data and control pins of the 64k and the 56k DRAMs are virtually identical, with the exception of pin No. 1 which is not used in the 64k DRAM and which is used as an additional address pinout in the 256k DRAM for accessing the larger number of memory locations therein.

Figure 2:
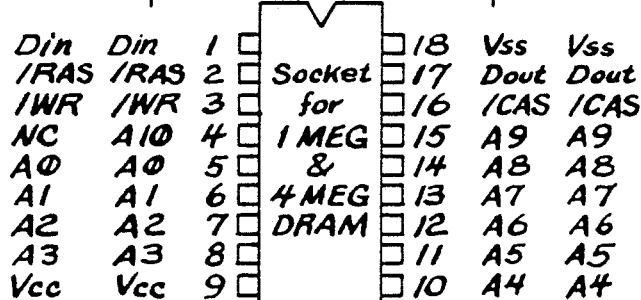
FIG. 2 is a simplified schematic diagram illustrating the pinout ar arrangement for 1Meg and 4Meg DRAMs.

Referring to FIG. 2, there is shown the pinout arrangement for 1Meg and 4Meg DRAMs. In the case of the 1Meg and 4Meg DRAMs, pin No. 9 corresponds to pin No. 8 in the 64k/256k DRAM for providing an input voltage Vcc to the DRAM. Similarly, pins 5 through 8 and 10 through 15 correspond to the address pins 5 through 7 and 9 through 13 of the 64k/256k DRAMs, with the additional address pins of the 1Meg/4Meg DRAMs needed to accommodate the additional memory locations in the 1Meg/4Meg DRAMs. The upper three pins on the right edge of the 1Meg/4Meg DRAM as shown in FIG. 2 are used for Vss (ground potential), Dout (Data Out), and /CAS (Column Address Strobe) as they are in the case of the 64k/256k DRAMs. Similarly, the upper three pins on the left edge of the 1Meg/4Meg DRAMs are used for the Din (Data In) /RAS (Row Address Strobe), and /WR (Read/Write) as they are in the case of the 64k/256k DRAM. Thus, in FIG. 2 it can be seen that virtually the same pins are used for carrying the same signals in both the 1Meg DRAM and the 4Meg DRAM with the exception that pin 4 is not used in the 1Meg DRAM, while this pin provides an additional address bit in the 4Meg DRAM. In comparing FIGS. 1 and 2, it can further be seen that, in general, the control and data pins of the 64k/256k DRAMs and the 1Meg/4Meg DRAMs are generally co-located in each of these ICs.

Figure 3:
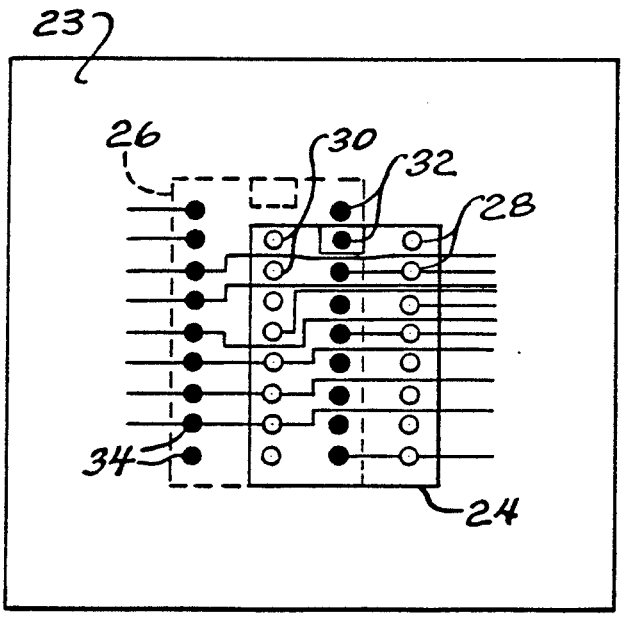
FIG. 3 illustrates a portion of the surface of a PC board which is adapted for mounting and coupling in circuit to ICs of different size and different pinout arrangements within a limited footprint on the PC board in accordance with the present invention.

Referring to FIG. 3, there is shown a portion of the surface of a PC board 23 configured in accordance with the present invention to accommodate both the 64k/256k DRAM as well as the 1Meg/4Meg DRAM for mounting and electrical coupling purposes. The IC mounting arrangement includes a first, 16-pin footprint 24 and a second, 18-pin footprint 26 which is shown in dotted line form in the figure. The first and second footprints 24, 26 are positioned on the PC board 23 in an overlapping manner and are each generally rectangular in shape. In order to accommodate two extra pinouts, the second, 18-pin footprint 26 is slightly longer than the first, 16-pin footprint 24.

Positioned within the first footprint 24 are first and second linear arrays of apertures 28 and 30. Each aperture in the first and second linear arrays of apertures 28, 30 is adapted to receive a respective lead or pinout of the 64k/256k DRAM 20. In addition, each aperture within the first and second linear arrays of apertures 28, 30 is electrically coupled in circuit on the PC board 23. FIG. 3 does not show all of these apertures coupled to an associated conductor since some of the conductors may be positioned on the lower surface of the PC board 23 or may be disposed between intermediate layers of the PC board.

The second footprint 26 includes third and fourth linear arrays of apertures 32, 34, which are filled in or blackened in order to distinguish these apertures from the first and second linear arrays of apertures 28 and 30. The third and fourth linear arrays of apertures 32, 34 are adapted to receive the pinouts of the 1Meg/4Meg DRAM 22 and to provide electrical connection therewith. Thus, each of the apertures in the third and fourth linear arrays of apertures 32, 34 is electrically coupled to a respective lead within or on the PC board 23. In this manner, the 1Meg/4Meg DRAM 22 may be coupled in circuit on the PC board 23.

As shown in FIG. 3, the first and second linear arrays of apertures 28, 30 are generally aligned parallel with the third and fourth linear arrays of apertures 32, 34. In addition, the third linear array of apertures 32 is disposed intermediate the first and second linear arrays of apertures 28, 30 and is spaced therefrom. Thus, none of the leads of the 64k/256k DRAM 20 are positioned within the first and second linear array of apertures 28, 30, nor are any of the leads of the 1Meg/4Meg DRAM 22 positioned within the third and fourth linear arrays of apertures 32, 34. An intermediate portion on the surface of the PC board 23 which includes the second and third linear arrays of apertures 30, 32 is positioned between the first and fourth linear array of apertures 28, 34 and allows for a reduced mounting area in positioning either the 16-pin or the 18-pin IC on the PC board 23.

There has thus been shown an improved arrangement for a PC board for the mounting of two different ICs having different sizes and pinouts using a limited surface area or footprint of the PC board. By overlapping the mounting areas of the first and second ICs and positioning one linear array of pinout apertures for one IC intermediate the pair of spaced linear arrays of apertures for the other IC, a minimum mounting area is provided which is adapted for mounting either the first or the second IC.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. A printed circuit (PC) board arrangement for mounting either a first dynamic random access memory (DRAM) having a first plurality of pinouts including first address and control pinouts or a second DRAM having a second plurality of pinouts including second address and control pinouts and for minimizing PC board area required for mounting either said first DRAM or said second DRAM, wherein said first and second DRAM's are of the same width and each plurality of pinouts is arranged in a pair of spaced, parallel arrays, said PC board arrangement comprising:

a first surface portion of the PC board having first means defining a first plurality of apertures arranged in a pair of spaced, parallel arrays and adapted to receive the first plurality of pinouts of said first DRAM, wherein said first plurality of apertures includes first and second linear, spaced rows of M apertures each; and a second surface portion of the PC board having second means defining a second plurality of apertures arranged in a pair of spaced, parallel arrays and adapted to receive the second plurality of pinouts of said second DRAM, wherein said first and second surface portions are disposed on the PC board in an overlapping manner and said second plurality of apertures includes third and fourth linear, spaced rows of N apertures each; and wherein $N = M + 1$ and said third row of apertures is disposed intermediate said first and second rows of apertures, said first, second, third and fourth rows of apertures are generally parallel, the spacing between said first and second rows of apertures is equal to the spacing between said third and fourth rows of apertures, and wherein all of said first apertures receiving said first address pinouts and at least one of said first apertures receiving said first control pinouts are coupled to and in alignment with corresponding pinouts of said second address and in control pinouts and wherein said alignment is generally transverse to said rows of apertures.

2. The PC board arrangement of claim 1 wherein said first and second surface portions of the PC board are generally rectangular.

3. The PC board arrangement of claim 2 wherein said second surface portion is larger than said first surface portion.

* * * * *